DUAL BANDWIDTH PHASE LOCK LOOP

Original Filed Nov. 6, 1972

United States Patent

Re. 28,452
Reissued June 10, 1975

28,452

DUAL BANDWIDTH PHASE LOCK LOOP

Drew R. Lance, Saratoga, Calif., assignor to California Microwave Incorporated, Sunnyvale, Calif.

Original No. 3,805,183, dated Apr. 16, 1974, Ser. No. 304,136, Nov. 6, 1972. Application for reissue Sept. 3, 1974, Ser. No. 502,747
Int. Cl. H03b *3/06*
U.S. Cl. 331—17 8 Claims

Matter enclosed in heavy brackets [ ] appears in the original patent but forms no part of this reissue specification; matter printed in italics indicates the additions made by reissue.

ABSTRACT OF THE DISCLOSURE

A phase lock loop in which the DC error signal output of a phase detector is coupled to the control input of a voltage controlled microwave oscillator through a signal translating circuit including an operational amplifier and an adaptive control network. The adaptive control network includes roll-off filter circuitry for defining the normal loop bandwidth, and a voltage follower circuit for overriding the roll-off circuits when the loop stress reaches a predetermined level and for developing a signal proportional to the error signal to thereby automatically increase the control capability of the loop.

BACKGROUND OF THE INVENTION

Figure 1:
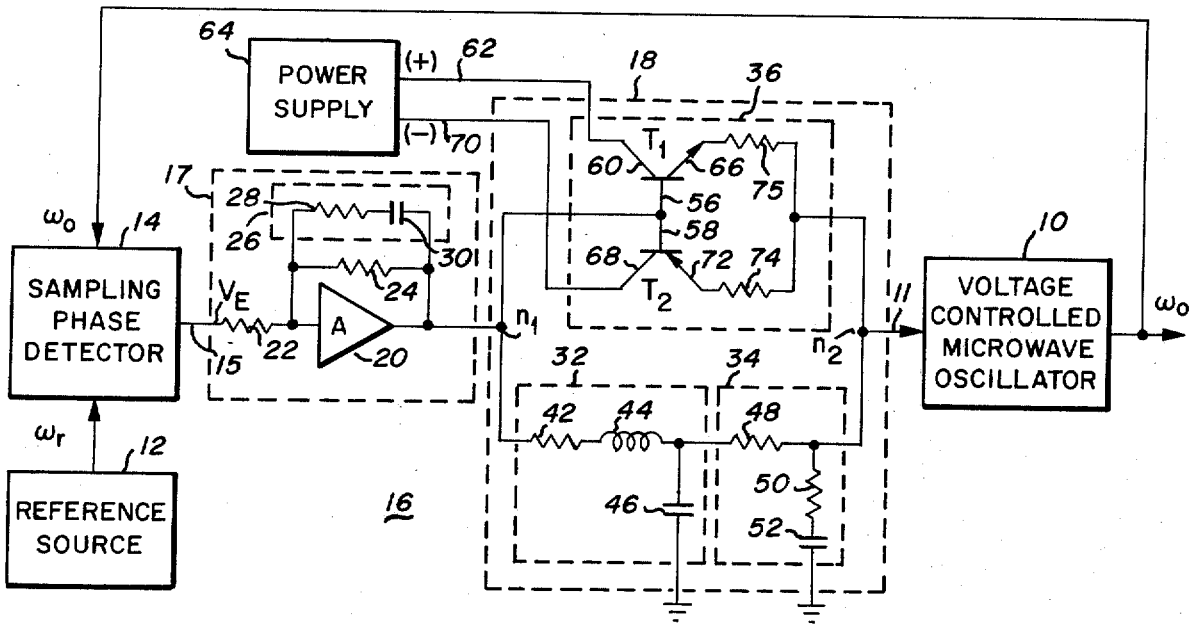

The present invention relates to an improved dual bandwidth phase lock control loop for microwave oscillators.

In providing frequency control circuitry for microwave oscillators, one of the primary considerations that must be dealt with is the loop stress which occurs in the phase lock loop due to internal noise as well as induced noise caused by mechanical shock or vibration. Such conditions are capable of disturbing the oscillator input frequency to such an extent that the loop error exceeds the correction capability of the loop and causes the oscillator to go from a stable condition to an unstable condition and thereby lose lock.

Although phase lock loops in general and dual bandwidth loops in particular have long been used in receiver circuits, as evidenced by the U.S. patents to Gruen 2,828,-419; Tschannen 3,293,560; De Lisle et al. 3,328,719; Hileman 3,363,194, and Taylor 3,421,105, these prior art circuits have dealt with receiver applications wherein the bandwidth of the loop is changed for the purpose of signal acquisition or discrimination. In other words, the bandwidth of the phase lock loop is extended in order to acquire or to track an incoming communication signal. The present invention, on the other and, deals not with signal acquisition since other prior art means, which will not be discussed herein, provide acquisition if lock is lost, but instead deals with a means for changing loop bandwidth before lock is lost so as to increase the amount of control and thus provide precision lock of the microwave frequency oscillator to the reference.

SUMMARY OF THE PRESENT INVENTION

It is therefore a primary object of the present invention to provide a dual bandwidth phase lock loop for microwave applications which is responsive to loop stress and operative to provide precision control of the oscillator during the time that the oscillator is considered to be in lock.

Briefly, the present invention is directed to a phase lock loop in which the DC error signal output of a phase detector is coupled to the control input of a voltage controlled microwave oscillator through a signal translating circuit including an operational amplifier and an adaptive control network. The operational amplifier serves to increase the gain of the error signal. The adaptive control network includes suitable roll-off filter circuitry for defining the normal loop bandwidth and a voltage follower circuit which serves to override the roll-off circuits when the loop stress reaches a predetermined level and to develop voltages proportional to the error signals to automatically increase the control capability of the loop.

Among the advantages of the present invention over the prior art is that precision control of the microwave oscillator may be achieved automatically even though loop stress conditions may reach proportions which would heretofore have caused the oscillator to lose lock.

Another advantage of the present invention is that it enables the use of special loop elements, both in band and out of band, which would heretofore have caused the loop to oscillate.

Other objects and advantages of the present invention will no doubt become apparent to those of ordinary skill in the art after having read the following detailed decription of a preferred embodiment which is shown in the several figures of the drawing.

IN THE DRAWING

Figure 2:
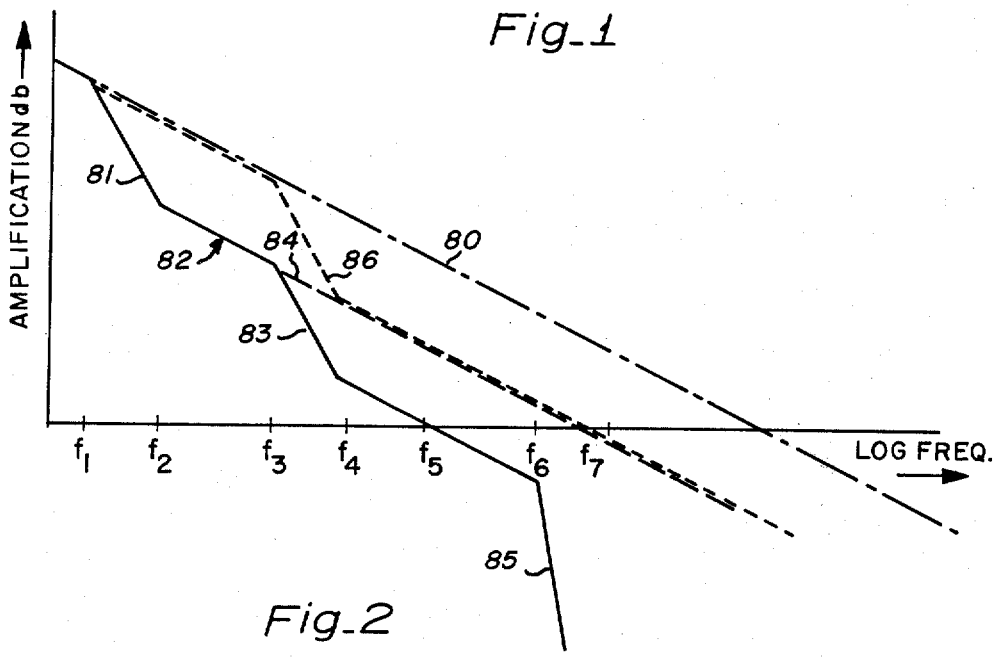

FIG. 1 is a schematic diagram illustrating a preferred embodiment of a dual bandwidth phase lock loop control circuit for microwave oscillators in accordance with the present invention; and FIG. 2 is an open loop gain vs. frequency diagram illustrating operation of the embodiment shown in FIG. 1.

DETAILED DESCRIPTION OF THE PREFERRED EMBODIMENT

Referring now to FIG. 1 of the drawing, there is shown a phase lock loop control circuit in accordance with a preferred embodiment of the present invention and including a voltage controlled microwave oscillator 10, a reference source 12 for generating a fixed frequency reference signal, a sampling phase detector 14 for comparing the phase of the output signal generated by oscillator 10 to the phase of the reference signal and signal translating means 16 for coupling the error signal developed at the output 15 of detector 14 to the control input 11 of oscillator 10.

Oscillator 10 may take the form of any suitable voltage controlled or YIG-tuned oscillator which responds to a DC control signal applied to its control input terminal 11 to change the phase or frequency of its output signal.

Phase detector 14 is an apparatus of the type which samples the two signals input thereto and develops a DC error signal proportional to any difference in their phase. The generated error signal is substantially linear so long as the difference in phase between the oscillator signal and the reference signal does not approach $\pm 90°$. This is of course well known in the prior art.

The signal translating circuit 16 includes a DC operational amplifier 17 connected in series with an adaptive control network 18. Op-amp 17 is comprised of a high gain amplifier 20 having an input resistor 22 and a feedback resistor 24. In addition, op-amp 17 includes a low pass roll-off filter circuit 26 comprised of a resistor 28 and capacitor 30 connected in series across resistor 24. Although op-amp 17 also provides roll-off attenuation its primary purpose is to amplify the error signal $V_E$ a level such that the desired control of oscillator 10 can be achieved. Therefore, in an alternative embodiment the roll-off filter circuit could be eliminated and placed elsewhere in the circuit if required.

Adaptive control network 18 is comprised of an out-of-band roll-off filter circuit 32, a low pass filter circuit 34 and a voltage follower circuit 36. Filter circuits 32 and 34 are connected in series between circuit nodes $n_1$ and $n_2$ while voltage follower circuit has its input terminal 38 coupled to circuit node $n_1$ and its output terminal 40 coupled to circuit node $n_2$.

Filter 32 includes a resistor 42 and inductor 44 connected in series, and a capacitor 46 coupling one end of inductor 44 to circuit ground. Filter circuit 34 includes a low-pass RC filter comprised of a resistor 48 having one end connected to the output end of filter 32 and the other end coupled to ground through a series circuit including a resistor 50 and a capacitor 52. The filters 32 and 34 thus, and except as explained below, serve to couple the output of op-amp 17 to the control input 11 of oscillator 10.

Voltage follower circuit 36, in the preferred embodiment, includes a pair of transistors $T_1$ and $T_2$, and a pair of resistors 74 and 75. $T_1$ is an npn transistor having its base 56 coupled to circuit node $n_1$ and the base 58 of transistor $T_2$, its collector 60 coupled to the positive voltage terminal 62 of a power supply 64, and its emitter 66 coupled to circuit node $n_2$ through resistor 75. $T_2$ is a pnp transistor having its base 58 coupled to node $n_1$, its collector 68 coupled to the negative terminal 70 of power supply 64, and its emitter 72 coupled to node $n_2$ and to the emitter 66 of transistor $T_1$ through resistor 74.

Turning now to the operation of the loop, it will be appreciated that as in prior art circuits even in the absence of the signal translating means 16 there will be a loop attenuation due to the frequency response characteristics of the various components in the loop. Since noise is always present in the loop as a result of component linearities, extraneous electrical field conditions, etc., this inherent loop attenuation tends to work to the advantage of the loop since it in effect provides a noise bandwidth which rejects noise components outside the band, and substantially attenuates those noise components having frequencies near the band limit. Although the loop bandwidth is chosen to obtain the best overall noise performance from the microwave oscillator, it is usually optimized to obtain the desired combination of reference performance and controlled oscillator performance. A typical amplification characteristic for a loop having the error signal $V_E$ coupled directly into terminal 11 is illustrated in FIG. 2 by the broken line 80.

Since the present invention is not a discriminator but is concerned with providing oscillator control for phase differences of less than $\pm 90°$ between oscillator 10 and source 12, it is desirable to attenuate as much as possible those noise signals which may appear in the loop. In accordance with the present invention this is accomplished through the use of roll-off filters 26, 32 and 34 which serve to further reduce the loop bandwidth as indicated by the curve 82, and thus enhance the noise attenuation characteristics of the loop. However, since noise induced in the loop by loop stress conditions is fed back through the loop in a direction which tends to correct the oscillator change, it is desirable under such conditions that the loop bandwidth be increased to allow these signals to pass momentarily through the loop to aid in driving the oscillator phase back towards the phase of the reference signal. In other words, under conditions of extreme loop stress, such as might result from shock conditions, device vibration, etc., it desirable to expand the bandwidth so as to increase the control capability of the loop.

In the preferred embodiment shown in FIG. 1 of the drawing, bandwidth expansion from that illustrated by curve 82 to some other value is accomplished automatically by means of the voltage follower circuit 36. In operation, upon sensing a voltage level at node $n_1$ exceeding a predetermined threshold value, circuit 36 causes a like voltage to be developed at node $n_2$ notwithstanding the presence of filters 32 and 34. Thus in effect, the result of such action is to remove the out-of-band filter 32 from the circuit and to modify the filtering characteristics of low-pass filter 34.

Referring again to FIG. 2 of the drawing, it will be appreciated that by selecting certain values for the resistances 48 and 50, and for the capacitor 52 of low-pass filter 34, the loop can be caused to exhibit a pole at some low frequency $f_1$ and a zero at some frequency $f_2$, thereby causing a standard 6 db per octave attenuation roll-off as indicated by the segment 81 of line 82. As an aid in understanding this operation, note that if only filter 34 was in the loop, i.e., in the absence of filters 26 and 32, the loop response would be substantially that illustrated by the dashed line 84, and the response curve would intercept the base line at some frequency $f_7$.

In order to further reduce the loop bandwidth so that the response curve intercepts the base line at some lower frequency $f_5$, an additional 6 db per octave roll-off as indicated by curve segment 83 is provided by selecting values for resistor 28 and capacitor 30 of filter 26 which give rise to a pole at the frequency $f_3$ and a zero at the frequency $f_4$.

If, in addition, it is desirable to further increase the rate of attenuation for frequencies above $f_5$, the values for resistor 42, inductor 44 and capacitor 46 of filter 32 can be selected so as to provide a double pole at the frequency $f_6$ giving rise to an 18 db per octave roll-off characteristic as indicated by the curve segment 85.

However, whereas the curve 82 may provide excellent control of oscillator 10 under average conditions, the control capability of the circuit under extreme loop stress conditions is markedly improved by expanding the loop bandwidth when such conditions occur. In accordance with the present invention, this is automatically accomplished as the error voltage $V_E$ developed at node $n_1$ exceeds the threshold potential of, for example, transistors $T_1$, at which time that transistor becomes conductive causing current from power supply 64 to flow through resistors 75 and 50 into capacitor 52 thereby developing a potential at node $n_2$ which is equivalent to that appearing at node $n_1$.

As pointed out above, this operation in effect eliminates the attenuation which would otherwise be provided by resistors 42 and 48 and inductor 44, and causes the potential developed at the input terminal 11 of oscillator 10 to follow that developed at the output of op-amp 17 and include the same noise components so long as the threshold potential of voltage follower 36 is exceeded. In other words, as illustrated in FIG. 2 the roll-off characteristics shown at 81 and 85 are in effect removed so that the frequency response characteristic resembles that shown by the dashed line 86.

On the other hand, where the potential developed at the output of op-amp 17 is less than the threshold of voltage follower 36, voltage follower 36 develops no output, and thus allows the error signal to be passed through filters 32 and 34 to oscillator 10 so that the response characteristic is as represented by curve 82.

By way of a specific example, consider a signal translating circuit of the type described having the following component values:

| | | |
|---|---|---|
| Resistor: | | |
| **22** | KΩ | 10 |
| **24** | KΩ | 680 |
| **28** | KΩ | 39 |
| Capacitor **30** | μf | .0018 |
| Resistor **42** | Ω | 560 |
| Inductor **44** | mh | 4.5 |
| Capacitor **46** | μf | .0068 |
| Resistor: | | |
| **48** | Ω | 390 |
| **50** | Ω | 27 |
| Capacitor **52** | μf | 2 |
| Resistor: | | |
| **74** | Ω | 10 |
| **75** | Ω | 10 |

Transistor $T_1$ and $T_2$ have a threshold potential of .7 volts.

Amplifier 20 has a gain of 100 and a saturation potential of 15 volts.

The detector 14 is assumed to have a maximum peak-to-peak output of ±.5 volts, and the control sensitivity of oscillator 10 is 200 kHz. per volt.

In such an embodiment it will be seen that during normal operating conditions in which the phase of oscillator 10 may tend to move only slightly away from that of source 12, loop noise will be substantially alternated by the narrow band loop characteristics and the loop bandwidth BW may be approximately expressed as $$BW = \frac{V_{\phi p\text{-to-}p} \times G \times K}{\pi}$$

where $V_{\phi p\text{-to-}p}$ is the maximum peak to peak output to phase detector 14;

G is the combination of amplifier gain with roll-off circuits; and

K is the control sensitivity of oscillator 10.

Hence, the bandwidth of this embodiment for error signals at node $n_1$ of less than .7 volt is approximately 4 kHz. However, as soon as any condition occurs which tends to cause the phase of the output signal $\omega_0$ of oscillator 10 to move rapidly away from the phase of the reference signal $\omega_f$, as evidenced by an error voltage of more than .7 volts at circuit node $n_1$, then voltage follower 36 will immediately begin operating to expand the loop bandwidth so that the bandpass characteristic will change to that illustrated by the dashed line 86 and thereby increase the control capability of the loop. In this case, the bandwidth would be increased to 65 kHz. And in addition, the double pole LC roll-off at 10 kc. which would cause the loop to oscillate in its broad band mode is removed from the circuit.

Whereas the present invention has, for purposes of illustration, been disclosed in terms of a simplified embodiment including a voltage follower circuit connected in shunt across a series combination of low-pass filters including an out-of-band filter 32, could alternatively take any of a number of forms, or could be eliminated entirely even though its presence in the circuit enables certain benefits to be obtained which have heretofore not been as easily obtainable. For example, if one were to attempt to use an out-of-band filter in a loop employing the band expansion techniques disclosed in the above mentioned prior art patents, the effect would be to produce an unstable loop. Furthermore, whereas a simple two transistor voltage follower 36 is shown in the example, it is to be understood that other circuits having threshold and amplification capabilities could just as well be used.

It is contemplated that still other modifications and alterations of the present invention will no doubt become apparent to those skilled in the art after having read the foregoing disclosure. Accordingly, it is to be understood that this particular apparatus described is for purposes of illustration only and the appended claims are to be interpreted as covering all such modifications and alterations as fall within the true spirit and scope of the invention.

What is claimed is:

[1. In a phase lock loop including a microwave oscillator responsive to a control signal and operative to develop a microwave output signal, a reference source for developing a fixed frequency reference signal, a phase detector responsive to said output signal and said reference signal and operative to develop an error signal commensurate with a difference in phase between said reference signal and said output signal, and signal translating means responsive to said error signal and operative to develop a control signal for controlling said oscillator, an improved signal translating means comprising:

means for amplifying said error signal; and an adaptive control network responsive to the amplified error signal and operative to develop said control signal for controlling the phase of said oscillator; said network including a first terminal for receiving said error signal and a second terminal connected to the control signal input of said oscillator, a low-pass filter circuit connected between said first terminal and said second terminal, and voltage-follower means including a first transistor having a base electrode connected to said first terminal, a collector electrode for connection to a first source of potential, and an emitter electrode connected to said second terminal, and a second transistor having a base electrode connected to said first terminal, a collector electrode for connection to a second source of potential and an emitter electrode connected to said second terminal, said control network having a first bandwidth characteristic when said amplified error signal is less than a predetermined threshold value and having a second bandwidth characteristic when said amplified error signal is greater than said threshold value.]

2. In a phase lock loop [as recited in claim 1 wherein said control network includes] *including a microwave oscillator responsive to a control signal and operative to develop a microwave output signal, a reference source for developing a fixed frequency reference signal, a phase detector responsive to said output signal and said reference signal and operative to develop an error signal commensurate with a difference in phase between said reference signal and said output signal, and signal translating means responsive to said error signal and operative to develop a control signal for controlling said oscillator, an improved signal translating means comprising:*

*means for amplifying said error signal; and*

*an adaptive control network responsive to the amplified error signal and operative to develop said control signal for controlling the phase of said oscillator; said network including*

*a first terminal for receiving said error signal and a second terminal connected to the control signal input of said oscillator,*

*a low-pass filter circuit connected between said first terminal and said second terminal,* an out-of-band filter circuit coupled in series with said low pass filter circuit between said first and second terminals, *and*

*voltage-follower means including a first transistor having a base electrode connected to said first terminal, a collector electrode for connection to a first source of potential, and an emitter electrode connected to said second terminal, and a second transistor having a base electrode connected to said first terminal, a collector electrode for connection to a second source of potential and an emitter electrode connected to said second terminal, said control network having a first bandwidth characteristic when said amplified error signal is less than a predetermined threshold value and having a second bandwidth characteristic when said amplified error signal is greater than said threshold value.*

3. In a phase lock loop as recited in claim [1] *2* wherein said low pass filter includes resistive and capacitive impedance elements for causing said loop to exhibit a pole at a first frequency and a zero at a second frequency.

4. In a phase lock loop as recited in claim 3 wherein said means for amplifying includes an operational amplifier.

5. In a phase lock loop as recited in claim 4 wherein said operational amplifier includes a feedback circuit having resistive and capacitive impedance elements for causing said loop to exhibit a pole at a third frequency and a zero at a fourth frequency.

6. A phase lock loop, comprising:

a microwave oscillator responsive to a control signal and operative to develop a microwave output signal, said oscillator having a control terminal for receiving said control signal;

a reference source for developing a fixed-frequency reference signal;

a phase detector responsive to said output signal and said reference signal and operative to develop an error signal commensurate with any difference in phase between said reference signal and said output signal;

an operational amplifier for amplifying said error signal, said amplifier having an amplifier input terminal for receiving said error signal and an amplifier output terminal;

an out-of-band filter and a low-pass filter connected in series between said amplifier output terminal and said control terminal; and voltage follower means including a first transistor having a first base electrode connected to said amplifier output terminal, a first collector electrode for connection to a first source of potential, and a first emitter electrode connected to said control terminal, and a second transistor having a second base electrode connected to said amplifier output terminal, a second collector electrode for connection to a second source of potential, and a second emitter electrode connected to said control terminal, whereby said loop has a first bandwidth determined by the impedances of said out-of-band filter and said low-pass filter when said amplified error signals are less than a predetermined threshold, and whereby said voltage-follower means is responsive to amplified error signals exceeding said predetermined threshold and is operative to effectively eliminate at least said out-of-band filter and cause said loop to have a second bandwidth.

7. A phase lock loop as recited in claim 6 wherein said low-pass filter includes resistive and capacitive elements for causing the loop response characteristic to roll-off over a first range of frequencies, said operational amplifier includes a low pass filter having resistive and capacitive elements for causing said loop response characteristic to roll-off over a second range of frequencies, and said out-of-band filter includes resistive, capacitive and inductive elements for causing said loop response characteristic to roll-off over a third range of frequencies.

8. A phase lock loop as recited in claim 6 wherein said low-pass filter includes resistive and capacitive impedance elements for causing said loop to exhibit a pole at a first frequency and a zero at a second frequency.

9. A phase lock loop as recited in claim 8 wherein said operational amplifier includes a feedback circuit having resistive and capacitive impedance elements for causing said loop to exhibit a pole at a third frequency and a zero at a fourth frequency.

References Cited

The following references, cited by the Examiner, are of records in the patented file of this patent or the original patent.

UNITED STATES PATENTS

| | | | |
|---|---|---|---|
| 3,316,497 | 4/1967 | Brooks | 331—17 |
| 3,586,992 | 6/1971 | Garfein | 331—17 |
| 3,566,145 | 2/1971 | Goodale | 307—235 |
| 3,611,168 | 10/1971 | Haggai | 331—18 X |
| 3,624,511 | 11/1971 | Sui | 331—17 X |
| 3,475,695 | 10/1969 | Kaminski | 331—25 |
| 2,962,666 | 11/1960 | Pollak | 331—17 X |
| 3,287,657 | 11/1966 | Widl | 331—25 X |
| 3,495,184 | 2/1970 | Perkins et al. | 331—25 X |

JOHN KOMINSKI, Primary Examiner

U.S. Cl. X.R.

331—8